US006973400B2

(12) United States Patent
Cahill-O'Brien et al.

(10) Patent No.: US 6,973,400 B2
(45) Date of Patent: Dec. 6, 2005

(54) SYSTEM AND METHOD FOR OSCILLATOR SELF-CALIBRATION USING AC LINE FREQUENCY

(75) Inventors: Barry Cahill-O'Brien, Spokane, WA (US); Mark K. Cornwall, Spokane, WA (US)

(73) Assignee: Itron, Inc., Spokane, WA (US)

( * ) Notice: Subject to any disclaimer, the term of this patent is extended or adjusted under 35 U.S.C. 154(b) by 109 days.

(21) Appl. No.: 10/683,551

(22) Filed: Oct. 10, 2003

(65) Prior Publication Data

US 2005/0080579 A1 Apr. 14, 2005

(51) Int. Cl.[7] ............................................. G01R 35/00
(52) U.S. Cl. .................. 702/106; 331/1 R; 331/177 R; 713/500
(58) Field of Search ................................ 702/106, 107; 375/354; 331/176, 1 R, 177 R; 713/502, 713/500, 501–503

(56) References Cited

U.S. PATENT DOCUMENTS

| | | | |
|---|---|---|---|
| 3,585,898 A | 6/1971 | Davidson | |
| 3,686,574 A | 8/1972 | Niman | |
| 3,725,766 A | 4/1973 | Brown | |
| 4,092,602 A | 5/1978 | Nishioka et al. | |
| 4,387,351 A | 6/1983 | Furiga et al. | |
| 4,714,893 A * | 12/1987 | Smith-Vaniz et al. | 324/126 |
| 4,902,964 A | 2/1990 | Szabela et al. | |
| 4,908,600 A | 3/1990 | Martinez | |
| 5,446,411 A | 8/1995 | Horsfall et al. | |
| 5,455,964 A * | 10/1995 | Roos et al. | 455/516 |
| 5,559,842 A | 9/1996 | Javitt | |
| 5,608,761 A | 3/1997 | Opas et al. | |
| 5,748,047 A | 5/1998 | Guthrie et al. | |
| 5,821,819 A | 10/1998 | Wolf | |
| 5,870,001 A | 2/1999 | Osterling et al. | |
| 6,064,270 A | 5/2000 | Douglas | |
| 6,240,556 B1 | 5/2001 | Evans et al. | |
| 6,249,192 B1 | 6/2001 | Gabara et al. | |
| 6,639,957 B2 * | 10/2003 | Cahill-O'Brien et al. | 375/354 |

FOREIGN PATENT DOCUMENTS

WO  WO 98/34123 A1  8/1998

* cited by examiner

*Primary Examiner*—John Barlow
*Assistant Examiner*—Hien Vo
(74) *Attorney, Agent, or Firm*—Patterson, Thuente, Skaar & Christensen, P.A.

(57) ABSTRACT

A self-calibrating radio frequency transmitter includes an adjustable oscillator, a first frequency counter, a second frequency counter, and a comparer. The radio frequency transmitter is powered by an AC power line, which presents a line frequency. The transmitter contains an adjustable frequency oscillator that oscillates at an oscillator frequency and has a desired operating frequency. The first frequency counter counts the oscillator frequency while the second frequency counter counts the line frequency. The comparer compares the counted oscillator frequency to the counted line frequency and produces an output representative of the difference between the counted line frequency and the counted oscillator frequency. This difference in frequency indicates a deviation in the oscillator frequency from the desired operating frequency. The output from the comparer is input to the oscillator to adjust the oscillator frequency back to the desired operating frequency.

18 Claims, 1 Drawing Sheet

SYSTEM AND METHOD FOR OSCILLATOR SELF-CALIBRATION USING AC LINE FREQUENCY

FIELD OF THE INVENTION

The present invention relates to frequency drift compensation of radio frequency transmitter reference clock oscillators and, more particularly, to frequency drift compensation of these oscillators through use of existing AC line frequency.

BACKGROUND OF THE INVENTION

Radio frequency transmitters need to maintain a very high frequency accuracy over their life span to meet the requirements of the Federal Communications Commission (FCC) and to operate with narrow frequency channels. In outdoor applications, this frequency accuracy must be maintained over a wide temperature range. The accuracy of the transmit frequency is directly related to the accuracy of the oscillator used in the transmitter. It is, therefore, imperative that the transmitter have a very stable and accurate oscillator.

To accomplish this stability and accuracy a temperature compensated oscillator is usually used. This type of oscillator, however, typically suffers from an aging effect over time that can cause the oscillator to shift out of its acceptable operating range. Aging typically is specified as a shift in frequency per year of use. To compensate for this shift, some oscillator manufacturers have enclosed oscillators inside a miniature oven, which reduces the temperature change stresses on the oscillator crystal and, hence, the aging drift. However, these oven-controlled oscillators are expensive and consume a large amount of power.

To accomplish a lower cost alternative to oven-controlled oscillators, other oscillator manufacturers have added a tuning connection that allows the transmitter manufacturer to calibrate out the errors of this aging drift.

As such, low cost oscillators that compensate for temperature are now readily available. If these oscillators are exposed to varying ambient temperatures over a long period of time, subtle changes occur in the crystal used in the oscillator, which cause its resonant frequency to shift. By applying a precise voltage to a calibration pin on the oscillator, the frequency can be adjusted back to the original specified frequency. Typical error due to aging is about 0.5 parts per million per year drift in frequency. The FCC usually requires a total drift at or about 1.5 parts per million over the life of the product. Temperature compensation can keep the oscillator within 1.0 parts per million, which suggests that the transmitter should be calibrated once per year. However, in the instance of a remote mounted transmitter, it is impractical to calibrate the transmitter on an annual basis at a service depot.

In an effort to avoid calibration of a transmitter's oscillator at a service depot, radio frequency networks have been designed whereby a minimal number of oven-controlled oscillators have been established within special reference transmitters. These special reference transmitters communicate with remote transmitter modules over a wireless link and can determine the accuracy of the remote transmitters clock by examining the frequency accuracy of the transmission from the remote transmitter. The accurate, oven-controlled clock in the reference transmitter is used to make this comparison. Once the error in frequency has been determined, the reference transmitter instructs the remote transmitter to retune its clock to eliminate the error.

As such, there is a need for a low-cost, self-calibrating oscillator that can completely eliminate the need, and costs associated with, oven-controlled oscillators.

SUMMARY OF THE INVENTION

The needs described above are in large part met by the self-calibrating system of the present invention. The system generally includes a radio frequency transmitter, an adjustable oscillator, a first frequency counter, a second frequency counter, and a comparer. The radio frequency transmitter is powered by an AC power line, which presents a line frequency. The transmitter contains an adjustable frequency oscillator that oscillates at an oscillator frequency and has a desired operating frequency. The first frequency counter counts the oscillator frequency while the second frequency counter counts the line frequency. The comparer compares the counted oscillator frequency to the counted line frequency and produces an output representative of the difference between the counted line frequency and the counted oscillator frequency. This difference in frequency indicates a deviation in the oscillator frequency from the desired operating frequency. The output from the comparer is input to the oscillator to adjust the oscillator frequency back to the desired operating frequency.

In a preferred embodiment of the invention, the comparer includes a microprocessor. As well, the system may additionally include a frequency divider, for dividing the oscillator frequency down to a level suitable for comparison with the line frequency, and a digital-to-analog converter for converting the digital output from the comparer to an analog signal suitable for input to the oscillator. Note that the difference in frequency generally indicates a deviation of the oscillator frequency from the desired operating frequency of greater than 0.5 parts per million. Further, the first frequency counter and the second frequency counter are preferably simultaneously restarted on a pre-defined periodic basis.

A method of the present invention includes the steps of: (1) counting the oscillator frequency; (2) counting the line frequency; (3) comparing the counted oscillator frequency to the counted line frequency to produce a difference in frequency that indicates a deviation of the oscillator frequency from the desired operating frequency; and (4) adjusting the oscillator frequency back to the desired operating frequency according to the difference in frequency.

DETAILED DESCRIPTION OF THE PREFERRED EMBODIMENTS

Figure 1:
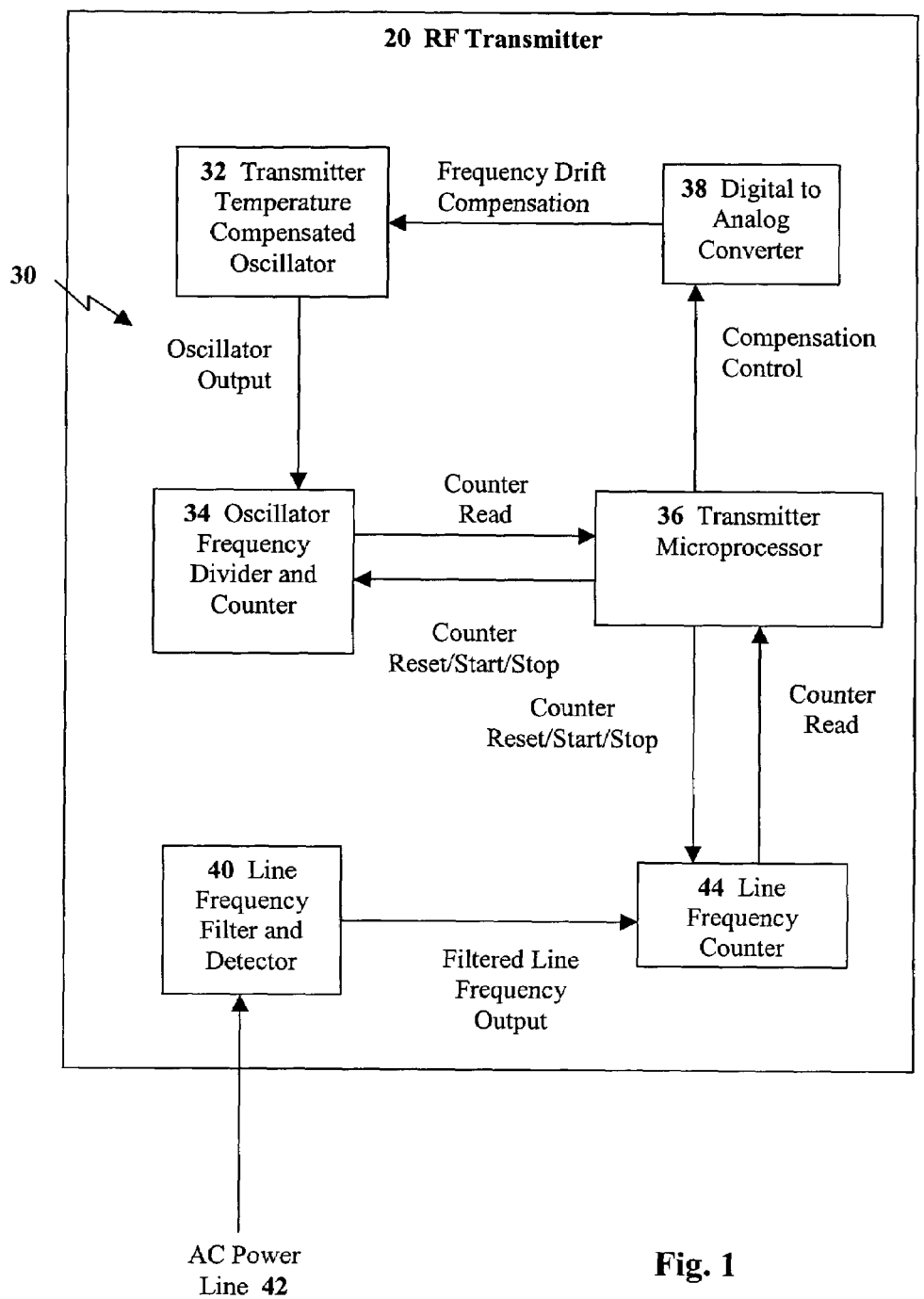
FIG. 1 is a block diagram of a radio frequency transmitter containing an AC line frequency compensated oscillator of the present invention.

The present invention is a system and method for oscillator calibration through use of AC line frequency. The present invention eliminates the need for expensive oven-controlled oscillators and enables oscillator, self-calibration of a remotely mounted transmitter by utilizing the same AC line power source that the transmitter, itself, is powered by. In a radio frequency fixed network system, the present invention helps to simplify network design by eliminating the need for special reference transmitters and their associated costs. The system and method is preferably used for frequencies in the 952 to 957 MHz range (Multiple Address System band or MAS band), however, the system and method is suitable for any RF communication system.

FIG. 1 depicts a radio frequency transmitter 20 incorporating the oscillator self-calibration system 30 of the present invention. As shown, the self-calibration system 30 includes a reference clock, temperature-compensatable oscillator 32 (e.g., the VITE VTC1 series oscillator), a frequency divider and counter 34, a microprocessor 36, a digital-to-analog converter 38, a line frequency filter and detector 40 supplied by an existing AC power line 42, and a line frequency counter 44. It should be noted that each of the system components may be formed through any suitable combination of electrical elements to achieve the desired functions.

In order for the transmitter 20 to self-calibrate, it must have access to a very accurate time base against which it can compare its oscillator 32. This very accurate time base is provided by the AC line frequency on AC power line 42.

Power generators in the United States try to maintain a line frequency of 60 Hz at all times, in an electric grid. This frequency will shift slightly over time due to varying generation load conditions at any time on the electric grid. The power generators are aware, however, that there are devices that rely on this line frequency to run smoothly and, hence, they try to compensate for any shift in line frequency, so that the total deviation in frequency from the ideal 60 Hz is less than 120 cycles over one month's time, or 120 cycles in 145 million cycles, or 0.8 parts per million error on average. A clock that uses the 60 Hz line frequency therefore has a maximum average error of plus or minus 2 seconds over time.

Thus, the transmitter 20 is configured to use the AC line frequency as a stable clock reference source to compare to its own oscillator 32. Any drift in frequency of the oscillator 32 appears as an error in a comparison over a long period of time, e.g., two months; the comparison is performed by the transmitter microprocessor 36. Since the oscillator 32 only needs to be calibrated for drift on an annual basis, ample time is provided to generate an accurate comparison.

The operation of the self-calibrating oscillator system 30 is provided hereinbelow. The reference clock, temperature compensated oscillator 32 of the transmitter 20 runs at a multi-megaHertz speed that must be divided down to a slower frequency using the clock divider 34 to make the oscillator clock rate easy to count. If a one kilohertz clock rate is assumed, the divided clock has 1 msec per clock cycle, which can be counted by frequency divider and counter 34. The line frequency filter and detector 40 of the transmitter 20 finds and filters the AC power line 42 voltage while the line frequency counter 44 counts the line frequency. With the two frequencies being counted, i.e., oscillator frequency and line frequency, the system 30 is now capable of self-calibration.

Specifically, on a continuous basis the transmitter 20 utilizes its components to count the line frequency and its own divided down oscillator frequency. For every 60 line frequency counts, the divided down oscillator frequency should generate 1000 counts. After approximately 30 million line frequency counts, the transmitter 20 knows that about 2 months have passed, and there is less than 0.5 parts per million absolute error in the line frequency count. The transmitter 20 can then use the microprocessor 36 to compare the line frequency count to the divided oscillator frequency count. If the difference between the expected divided count (1000 counts for every 60 line counts) and the actual count is less than the allowable error (2000 in this example) then the oscillator 32 of the transmitter 20 has an error of greater than 0.5 parts per million, and the oscillator calibration can be adjusted by changing the voltages on the calibration pin of the oscillator chip. The voltage is changed by the microprocessor 36 providing a compensation output, based on the count comparison, in digital form to the digital to analog converter 38, where the output is converted to an analog voltage suitable for input to the oscillator 32.

Once the compensation, i.e., the self-calibration, of the oscillator 32 is completed, the counting of line frequency and oscillator frequency is restarted in preparation for another comparison thereby completing the continuous, self-calibrating operation of the oscillator 32 of transmitter 20.

Note that the self-calibrating oscillator system 30 is preferably designed to handle power outages by stopping the counting of both the line frequency and the oscillator frequency. Upon AC power being restored to the transmitter 20, the counting of the line frequency and oscillator frequency is continued. A power outage does not affect the accuracy of the calibration, only the time it takes to calibrate. Further, the relatively long calibration periods (60 days) are short when compared to the drift time (one year), and are required to isolate daily temperature errors from long term drift. Note that calibration time can be extended to reduce the error below 0.5 parts per million.

In view of the above, a low-cost, radio frequency fixed network system can be implemented and its operating performance maintained over time, without the need for complex re-calibration schemes which add extra cost and development time to the system. Each transmitter can contain its own self-calibrating oscillator eliminating the need for reference transmitters and oven-controlled oscillators.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed:

1. A self-calibrating radio frequency transmitter wherein said transmitter is powered by an AC power line and wherein said AC power line presents a line frequency, comprising:
an adjustable oscillator wherein said oscillator oscillates at an oscillator frequency, and has a desired operating frequency;
a first frequency counter, wherein said first frequency counter counts said oscillator frequency;
a second frequency counter, wherein said second frequency counters counts said line frequency of said AC power line; and
a comparer, wherein said comparer compares the counted oscillator frequency against the counted line frequency and produces an output representative of the difference between said counted oscillator frequency and said counted line frequency, wherein said difference indicates a deviation in said oscillator frequency from said desired operating frequency, and wherein said output is input to said adjustable oscillator to adjust said oscillator frequency back to said desired operating frequency.

2. The transmitter of claim 1, wherein said comparer comprises a microprocessor.

3. The transmitter of claim 1, wherein said difference indicates a deviation of said oscillator frequency from said desired operating frequency of greater than 0.5 parts per million.

4. The transmitter of claim 1, further comprising a frequency divider, wherein said frequency divider divides down said oscillator frequency.

5. The transmitter of claim 1, further comprising a digital to analog converter, wherein said output is a digital output and wherein said digital to analog converter converts said digital output to an analog output suitable for input to said adjustable oscillator.

6. The transmitter of claim 1, wherein said first frequency counter and said second frequency counter are simultaneously restarted on a pre-defined periodic basis.

7. A method for self-calibration of a radio frequency transmitter wherein said transmitter includes an oscillator having both an oscillator frequency and a desired operating frequency, and wherein said transmitter is powered by an AC power line and wherein said AC power line presents a line frequency, the method comprising the steps of:
   counting said oscillator frequency;
   counting said line frequency of said AC power line;
   comparing the counted oscillator frequency to the counted line frequency to produce a difference in frequency, wherein said difference in frequency indicates a deviation of said oscillator frequency from said desired operating frequency; and
   adjusting said oscillator frequency back to said desired operating frequency according to said difference in frequency.

8. The method of claim 7, wherein the step of comparing is performed by a microprocessor.

9. The method of claim 7, wherein said difference in frequency comprises a deviation of said oscillator frequency from said desired operating frequency of greater than 0.5 parts per million.

10. The method of claim 7, further comprising the step of dividing said oscillator frequency to a level suitable for counting.

11. The method of claim 7, further comprising the step of converting said difference in frequency to a signal suitable for input to said oscillator.

12. The method of claim 7, wherein said step of counting said oscillator frequency and said step of counting said line frequency are simultaneously restarted on a pre-defined periodic basis.

13. A self-calibrating radio frequency transmitter wherein said transmitter includes an oscillator having both an oscillator frequency and a desired operating frequency, and wherein said transmitter is powered by an AC power line and wherein said AC power line presents a line frequency, comprising:
   means for counting said oscillator frequency;
   means for counting said line frequency from said AC power line;
   means for comparing the counted oscillator frequency to the counted line frequency to produce a difference in frequency, wherein said difference in frequency indicates a deviation of said oscillator frequency from said desired operating frequency; and
   means for adjusting said oscillator frequency back to said desired operating frequency according to said difference in frequency.

14. The transmitter of claim 13, wherein said means for comparing comprises a microprocessor.

15. The transmitter of claim 13, wherein said difference in frequency comprises a deviation of said oscillator frequency from said desired operating frequency of greater than 0.5 parts per million.

16. The transmitter of claim 13, further comprising means for dividing said oscillator frequency to a level suitable for counting.

17. The transmitter of claim 13, further comprising means for converting said difference in frequency to a signal suitable for input to said oscillator.

18. The transmitter of claim 13, wherein said means for counting said oscillator frequency and said means for counting said line frequency are simultaneously restarted on a periodic basis.

* * * * *